(12) United States Patent
Seino

(10) Patent No.: US 10,014,182 B2
(45) Date of Patent: Jul. 3, 2018

(54) PATTERN FORMATION METHOD

(71) Applicant: KABUSHIKI KAISHA TOSHIBA, Tokyo (JP)

(72) Inventor: Yuriko Seino, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/263,734

(22) Filed: Sep. 13, 2016

(65) Prior Publication Data

US 2017/0250071 A1     Aug. 31, 2017

(30) Foreign Application Priority Data

Feb. 29, 2016  (JP) ................................ 2016-036852

(51) Int. Cl.
| | |
|---|---|
| *H01L 21/308* | (2006.01) |
| *H01L 21/027* | (2006.01) |
| *B81C 1/00* | (2006.01) |
| *H01L 21/033* | (2006.01) |
| *H01L 21/311* | (2006.01) |

(52) U.S. Cl.
CPC ...... *H01L 21/3086* (2013.01); *B81C 1/00007* (2013.01); *B81C 1/00031* (2013.01); *H01L 21/0273* (2013.01); *H01L 21/0337* (2013.01); *H01L 21/0338* (2013.01); *H01L 21/3088* (2013.01); *H01L 21/31144* (2013.01); *B81C 2201/0149* (2013.01)

(58) Field of Classification Search
None
See application file for complete search history.

(56) References Cited

U.S. PATENT DOCUMENTS

| | | |
|---|---|---|
| 8,703,407 B2 | 4/2014 | Seino et al. |
| 8,808,557 B1 | 8/2014 | Seino et al. |
| 2014/0097152 A1 | 4/2014 | Hieda et al. |

(Continued)

FOREIGN PATENT DOCUMENTS

JP      2014-060189       4/2014

OTHER PUBLICATIONS

Chi-Chun Liu et al., "Towards an all-track 300 mm process for directed self-assembly", *Journal of Vacuum Science & Technology B*, Oct. 18, 2011, vol. 29, Iss. 6, pp. 06F203-1-06F203-6.

(Continued)

*Primary Examiner* — Jiong-Ping Lu
(74) *Attorney, Agent, or Firm* — Finnegan, Henderson, Farabow, Garrett & Dunner, L.L.P.

(57) ABSTRACT

According to one embodiment, a pattern formation method includes forming a base structure including first and second guide portions each including a pinning portion, and a neutral portion, forming a block copolymer film containing first and second polymers on the bass structure, performing a predetermined treatment for the block copolymer film, thereby forming first and second pattern portions formed of the first polymer, forming third and fourth pattern portions formed of the second polymer, and forming a fifth pattern portion formed of the first and second polymers. The fifth pattern portion includes a plurality of first portions formed of the second polymer, and a second portion formed of the first polymer and provided on the neutral portion and the first portions.

19 Claims, 9 Drawing Sheets

(56) References Cited

U.S. PATENT DOCUMENTS

2014/0287587 A1* 9/2014 Lee .................... B81C 1/00031
438/694
2015/0311442 A1 10/2015 Seino et al.

OTHER PUBLICATIONS

Marcus Müller et al., "Computing free energies of interfaces in self assembling systems", *Physical Chemistry Chemical Physics*, Mar. 28, 2009 vol. 11, No. 12, pp. 2087-2097.

* cited by examiner

PATTERN FORMATION METHOD

CROSS-REFERENCE TO RELATED APPLICATIONS

This application is based upon and claims the benefit of priority from Japanese Patent Application No. 2016-036852, filed Feb. 29, 2016, the entire contents of which are incorporated herein by reference.

FIELD

Embodiments described herein relate generally to a pattern formation method.

BACKGROUND

As a lithographic technology of a semiconductor device, a method using directed self-assembly (DSA) has been proposed. By using the DSA technology, microscopic patterns can be formed.

However, with a conventional method using the DSA technology, only one type of a pattern such as only a line-and-space (L/S) pattern or only a hole pattern can be formed by a single DSA process. For this reason, it is difficult to form patterns efficiently.

Therefore, a pattern formation method whereby patterns can be formed efficiently is desired.

DETAILED DESCRIPTION

In general, according to one embodiment, a pattern formation method includes: forming a base structure on an underlying region, the base structure including first and second guide portions each including a pinning portion having a higher affinity for a first polymer than for a second polymer, and each extending in a first direction, and a neutral portion located between the first and second guide portions and having an affinity for the first and second polymers; forming a block copolymer film containing the first and second polymers on the base structure; performing a predetermined treatment for the block copolymer film, thereby forming first and second pattern portions formed of the first polymer on the first and second guide portions, forming third and fourth pattern portions formed of the second polymer on the neutral portion, and forming a fifth pattern portion formed of the first and second, polymers between the third and fourth pattern portions, the fifth pattern portion including a plurality of first portions formed of the second polymer, and a second portion formed of the first polymer and provided on the neutral portion and the first portions; and removing the first and second pattern portions and the second portion of one fifth pattern portion to form first and second trench patterns and a plurality of first hole patterns.

Embodiments will be described hereinafter with reference to the accompanying drawings. Note that a method described below as the embodiment can be applied to a method of manufacturing a semiconductor device (a semiconductor integrated circuit device).

FIGS. 1A to 1I are cross-sectional views which schematically show a pattern formation method according to the embodiment. Hereinafter, the pattern formation method of the present embodiment will be described with reference to FIGS. 1A to 1I.

Figure 1A:
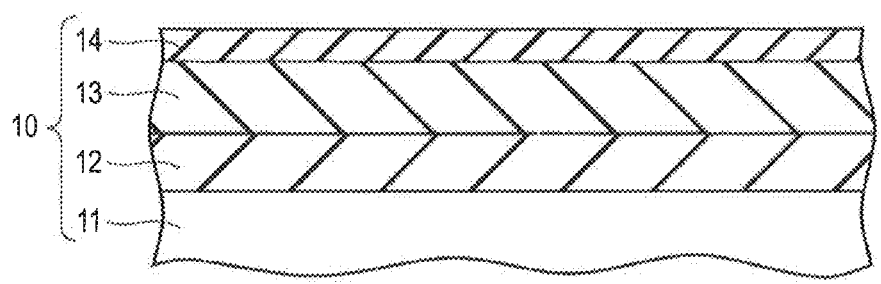
FIG. 1A is a cross-sectional view which schematically shows a part of a pattern formation method according to an embodiment.

First, as shown in FIG. 1A, a silicon oxide film 12 having a thickness of 100 nm is formed on a structure 11 including a semiconductor substrate, a transistor, etc., as a film to be processed. Next, on the silicon oxide film 12, a spin-on-carbon (SOC) film 13 having a thickness of 150 nm, and a spin-on-glass (SOG) film 14 having a thickness of 35 nm, which serve as a hard mask and an antireflection film, are formed. In this way, an underlying region 10 including the structure 11, the silicon oxide film 12, the SOC film 13, and the SOG film 14 described above can be obtained.

Figure 1B:
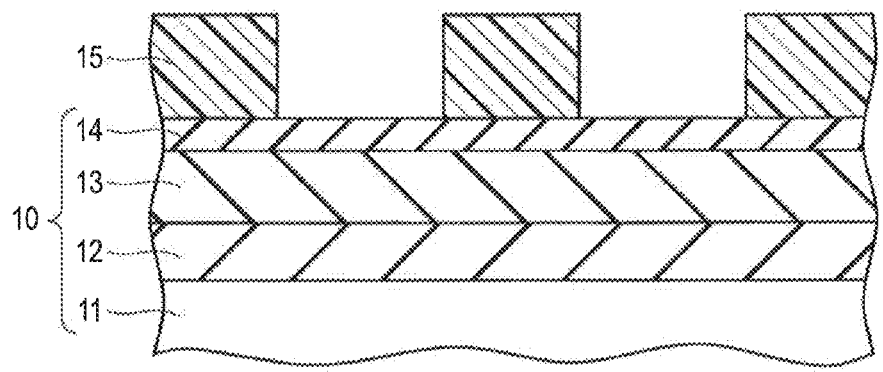
FIG. 1B is a cross-sectional view which schematically shows a part of the pattern formation method according to the embodiment.

Next, as shown in FIG. 1B, a positive resist, pattern 15 is formed on the underlying region 10. More specifically, first, a positive photoresist film 15 having a thickness of 100 nm is formed on the SOG film 14 by spin coating. After that, by using the ArF excimer laser, the photoresist film 15 is exposed by immersion exposure (at an exposure amount of 15 mJ/cm$^2$). Further, development is performed by using a TMAH developer. By means of the resist pattern 15 formed in this way, a line-and-space (i.e., an L/S pattern) having the desired line width and space width can be obtained. The resist pattern 15 extends perpendicular to the plane of the drawing (i.e., a first direction).

Figure 1C:
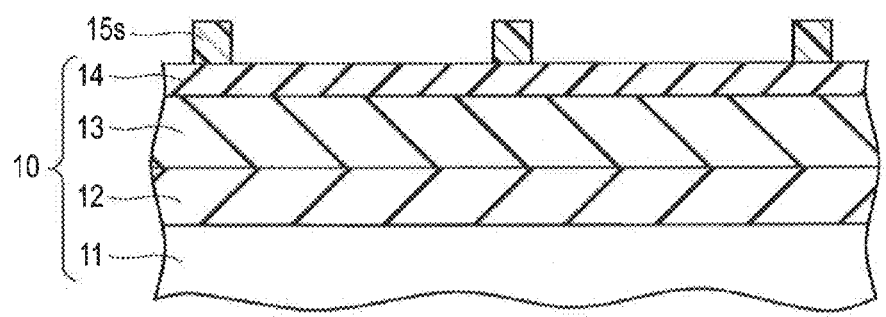
FIG. 1C is a cross-sectional view which schematically shows a part of the pattern formation method according to the embodiment.

Next, as shown in FIG. 1C, the resist pattern 15 is slimmed. More specifically, by performing reactive ion etching (RIE) using oxygen gas ($O_2$ gas), a slimmed resist pattern 15s is formed.

Figure 1D:
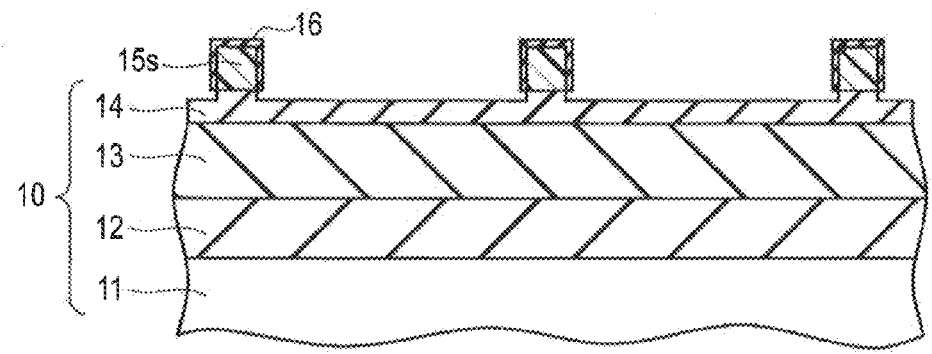
FIG. 1D is a cross-sectional view which schematically shows a part of the pattern formation method according to the embodiment.

Next, as shown in FIG. 1D, the SOG film 14 is etched by using the slimmed resist pattern 15s as a mask, and the SOG film 14 is thinned. More specifically, by the RIE using CF-based gas, the SOG film 14 is etched. The degree of etching (etching depth) is approximately 5 nm. As the SOG film 14 is etched, an etching product containing silicon is created, and the etching product is deposited on a surface of the slimmed resist pattern 15s. As a result, on the surface of the slimmed resist pattern 15s, a pinning portion 16 having a higher affinity for polymethyl methacrylate (PMMA [first polymer]), which will be described later, than for polystyrene (PS [second polymer]) is formed. The pinning portion 16 is insoluble in an organic solvent used in a subsequent process.

Figure 1E:
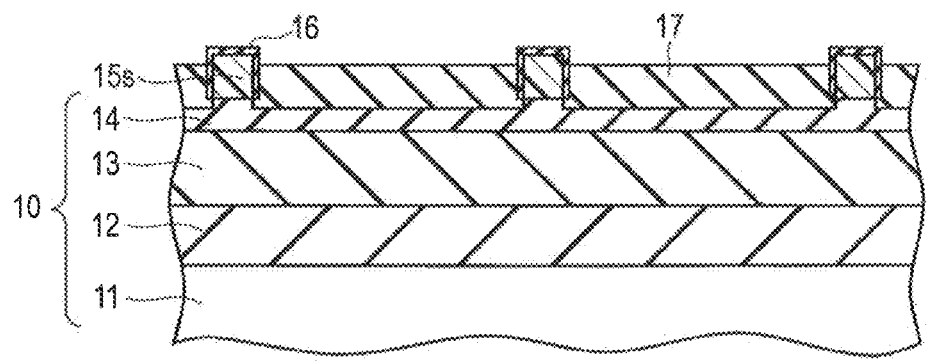
FIG. 1E is a cross-sectional view which schematically shows a part of the pattern formation method according to the embodiment.

Next, as shown in FIG. 1E, a P(S-r-MMA)-OH (hydroxy terminated poly (styrene-random-methyl methacrylate) film 17 is applied to the SOG film 14 which has been thinned by the etching. After that, the P(S-r-MMA)-OH film 17 is heated so that it reacts with the SOG film 14.

Figure 1F:
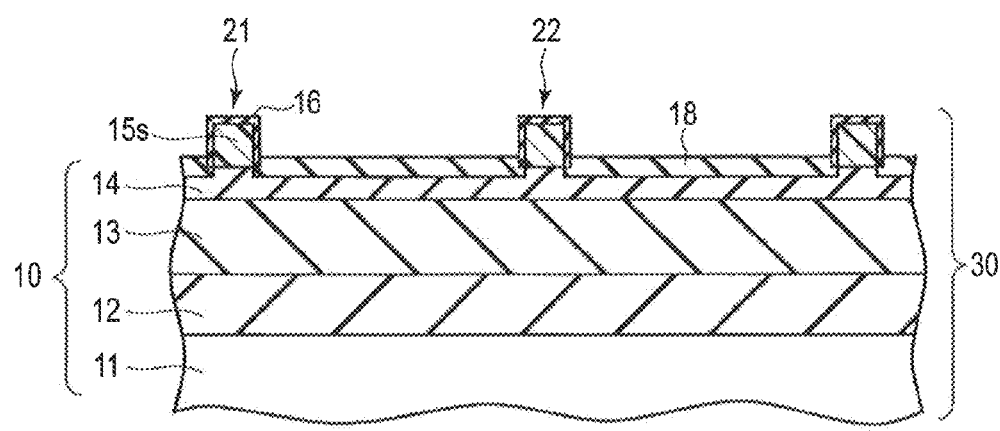
FIG. 1F is a cross-sectional view which schematically shows a part of the pattern formation method according to the embodiment.

Next, as shown in FIG. 1F, an unreacted portion of the P(S-r-MMA)-OH film 17 is removed by a PGMEA thinner. As a result, a neutral film (neutral portion) 18 having affinity for PMMA (the first polymer) and PS (the second polymer) is formed on the SOG film 14. That is, the neutral film 18 is formed on the underlying region 10 which is not covered by the slimmed resist pattern 15s. The thickness of the neutral film 18 is approximately 3 nm. The neutral film 18 contains a PMMA component and a PS component. Accordingly, the water contact angle of the neutral film 18 is intermediate between that of PMMA and that of PS. Therefore, PMMA and PS both have affinity for the neutral film.

As described above, a base structure 30 including a plurality of guide portions (a first guide portion 21 and a second guide portion 22) each including the pinning portion 16 and extending in the first direction (i.e., perpendicular to the plane of the drawing), and the neutral portion 18 located between the adjacent guide portions (the first guide portion 21 and the second guide portion 22) is formed on the underlying region 10. The first guide portion 21 and the second guide portion 22 have the same width. Also, each of the first guide portion 21 and the second guide portion 22 serves as a chemical guide to preferentially arrange PMMA on the first and second guide portions 21 and 22.

Figure 1G:
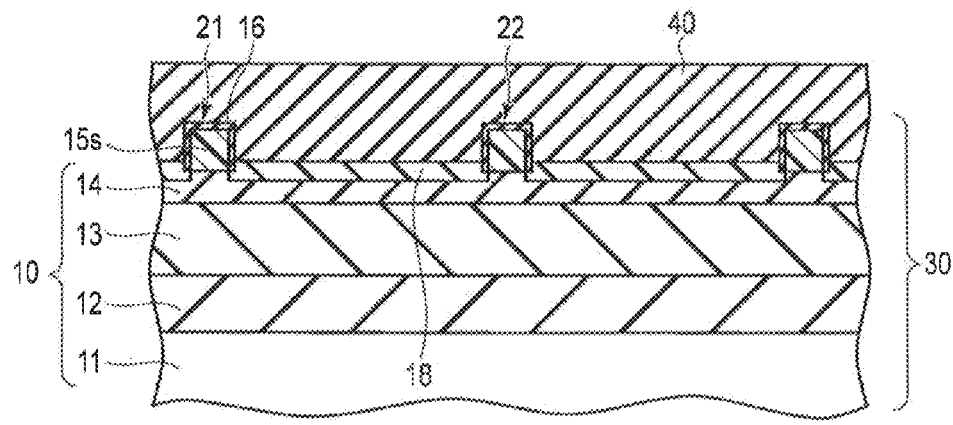
FIG. 1G is a cross-sectional view which schematically shows a part of the pattern formation method according to the embodiment.

Next, as shown in FIG. 1G, a block copolymer film 40 containing PMMA and PS is formed on the base structure 30 (the first guide portion 21, the second guide portion 22, and the neutral film 18). More specifically, as the block copolymer, lamellar PS-b-PMMA (PMMA and PS set to a volume composition ratio of 1:1) is adjusted to a concentration of 1.0 wt % by a PGMEA solution. The solution adjusted as described above is rotated at 1500 rpm and applied to the base structure 30.

Figure 1H:
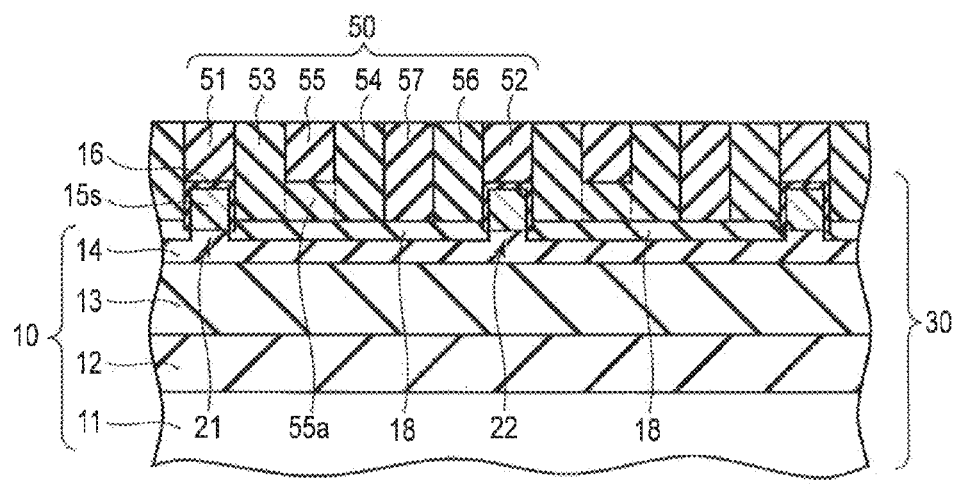
FIG. 1H is a cross-sectional view which schematically shows a part of the pattern formation method according to the embodiment.

Next, as shown in FIG. 1H, as a predetermined treatment, heat treatment is performed for the block copolymer film 40. More specifically, first, baking is performed at 110° C. for 60 seconds. Further, in a nitrogen gas ($N_2$ gas) atmosphere, an annealing process is performed at 290° C. for 30 minutes. By such a process, microphase separation is performed for the block copolymer film 40. In the microphase separation, PMMA is extracted on the pinning portion 16 of the first guide portion 21 and the second guide portion 22. As a result, a phase-separation pattern 50 is formed on the first and second guide portions 21 and 22, and the neutral film 18.

Figure 2:
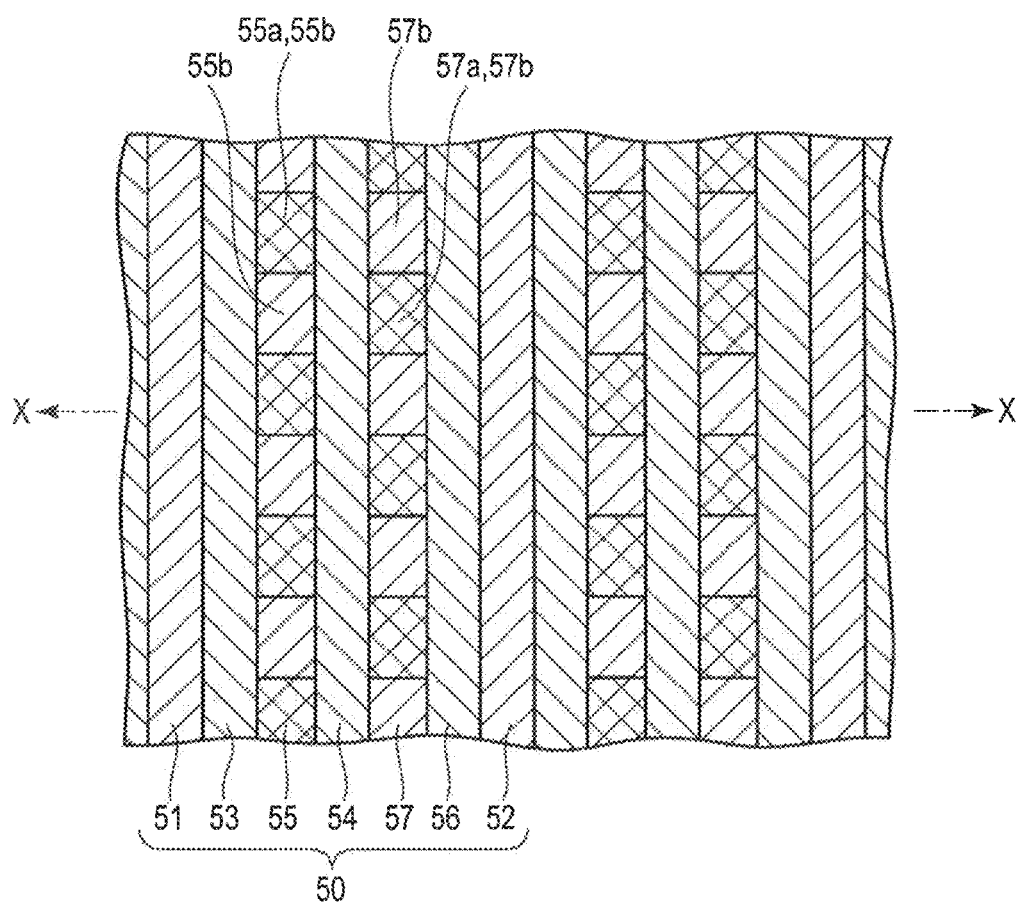
FIG. 2 is a plan view which schematically shows a part of the pattern formation method according to the embodiment.

FIG. 2 is a plan view which schematically shows the structure corresponding to FIG. 1H. A cross-section taken along line X-X of FIG. 2 corresponds to FIG. 1H.

As shown in FIG. 1H and FIG. 2, the phase-separation pattern 50 includes a first pattern portion 51, a second pattern portion 52, a third pattern portion 53, a fourth pattern portion 54, a fifth pattern portion 55, a sixth pattern portion 56, and a seventh pattern portion 57. More specifically, the third pattern portion 53 and the fourth pattern portion 54 are formed between the first pattern portion 51 and the second pattern portion 52, the fifth pattern portion 55 is formed between the third pattern portion 53 and the fourth pattern portion 54, the sixth pattern portion 56 is formed between the second pattern portion 52 and the fourth pattern portion 54, and the seventh pattern portion 57 is formed between the fourth pattern portion 54 and the sixth pattern portion 55. These pattern portions are repetitively arranged in a second direction perpendicular to the first direction.

The first pattern portion 51 and the second pattern, portion 52 are formed on the first guide portion 21 and the second guide portion 22, respectively. The first pattern portion 51 and the second pattern portion 52 are formed of PMMA, and extend in the first direction.

The third pattern portion 53, the fourth pattern portion 54, and the sixth pattern portion 56 are substantially equivalent patterns, and are formed on the neutral portion 18. The third pattern portion 53, the fourth pattern portion 54, and the sixth pattern portion 56 are formed of PS, and extend in the first direction.

The fifth pattern portion 55 is provided on the neutral portion 16, and formed between the third pattern portion 53 and the fourth pattern portion 54. The fifth pattern portion 55 extends in the first direction, and includes a plurality of first portions 55a formed of PS, and a second portion 55b formed of PMMA. The plurality of first portions 55a are formed on the neutral portion 18, and arranged in the first direction. The second portion 55b is continuously formed on the neutral portion 18 and the first portions 55a. Also, the plurality of first portions 55a are periodically arranged in the first direction.

The seventh, pattern portion 57 is provided on the neutral portion 18, and formed between the fourth pattern portion 54 and the sixth pattern portion 56. The seventh pattern portion 57 extends in the first direction, and includes a plurality of third portions 57a formed of PS, and a fourth portion 57b formed of PMMA. The plurality of third portions 57a are formed on the neutral portion 18, and arranged in the first direction. The fourth portion 57b is continuously formed on the neutral portion 18 and the third portions 57a. Also, the plurality of third portions 57a are periodically arranged in the first direction.

The fifth pattern portion 55 and the seventh pattern portion 57 are substantially equivalent patterns, and the first portion 55a of the fifth pattern portion 55 and the third portion 57a of the seventh pattern portion 57 are alternately arranged, as viewed from the second direction perpendicular to the first direction. That is, the first portion 55a of the fifth pattern portion 55 and the third portion 57a of the seventh pattern portion 57 are arranged diagonally with respect to the direction in which the first to seventh patterns are extended (i.e., the first direction).

Figure 1I:
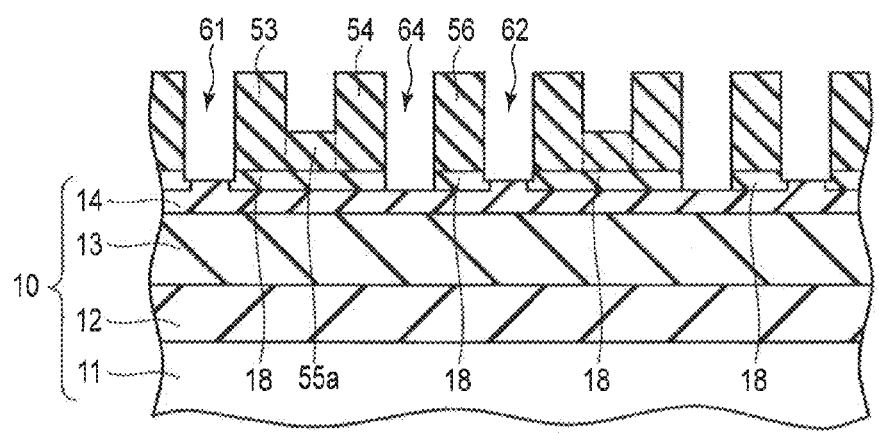
FIG. 1I is a cross-sectional view which schematically shows a part of the pattern formation method according to the embodiment.

Next, as shown in FIG. 1I, the first pattern portion 51, the second pattern portion 52, the second portion 55b of the fifth pattern portion 55, and the fourth portion 57b of the seventh pattern portion 57 are removed. That is, exposed portions of PMMA are removed. More specifically, the exposed portions of PMMA are removed by the RIE using oxygen gas (O₂ gas). At this time, the first and second guide portions 21 and 22, and a part of the neutral portion 18 are also removed. Consequently, a first trench pattern 61 and a second trench pattern 62 extending in the first direction, and a plurality of first hole patterns 63 and a plurality of second hole patterns 64 arranged in the first direction are formed. At the bottom of the respective first hole patterns 63 and second hole patterns 64, the SOG film 14 included in the underlying region 10 is exposed.

Figure 3:
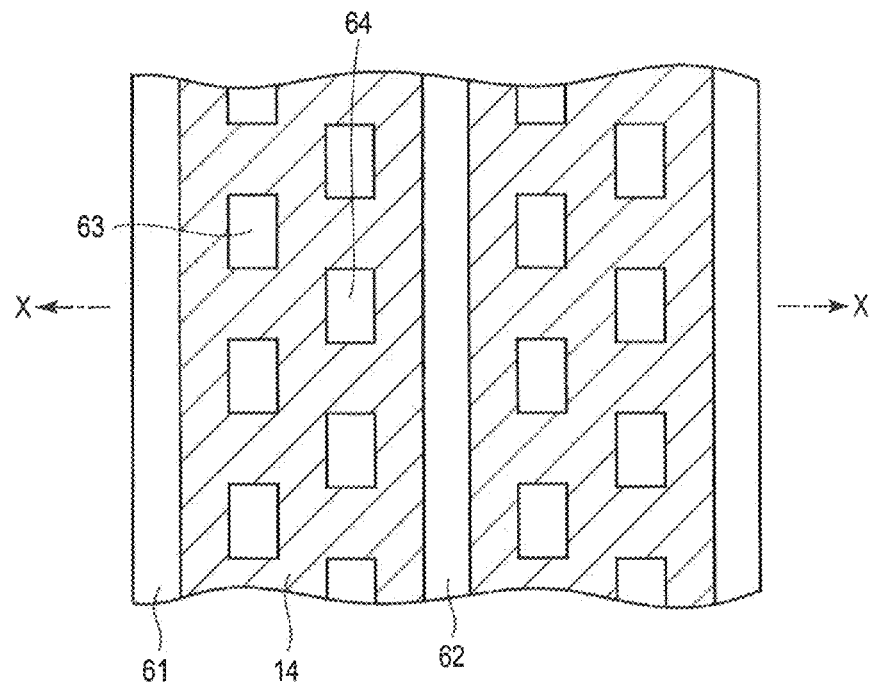
FIG. 3 is a plan view which schematically shows a part of the pattern formation method according to the embodiment.

FIG. 3 is a plan view which schematically shows the structure corresponding to FIG. 1I. A cross-section taken along line X-X of FIG. 3 corresponds to FIG. 1I.

As shown in FIG. 1I and FIG. 3, the first trench pattern 61 is formed by removing the first pattern portion 51 and the first guide portion 21. The second trench pattern 62 is formed by removing the second pattern portion 52 and the second guide portion 22. The plurality of first hole patterns 63 are formed by removing the second portion 55b of the fifth pattern portion 55. The plurality of second hole patterns 64 are formed by removing the fourth portion 57b of the seventh pattern portion 57.

The first hole patterns 63 and the second hole patterns 64 are periodically arranged in the first direction. Also, each of the first hole patterns 63 is surrounded by the third pattern portion 53, the fourth pattern portion 54, and the adjacent first portions 55a of the fifth pattern portion 55. Similarly, each of the second hole patterns 64 is surrounded by the fourth pattern portion 54, the sixth pattern portion 56, and the adjacent third portions 57a of the seventh pattern portion 57.

The first hole pattern 63 and the second hole pattern 64 are alternately arranged, as viewed from the second direction perpendicular to the first direction. That is, the first hole pattern 63 and the second hole pattern 64 are arranged diagonally with respect to the direction in which the first trench pattern 61 and the second trench pattern 62 are extended (i.e., the first direction).

Although a process after the process of FIG. 1I is not illustrated, by using a pattern formed of PS (i.e., a PS pattern) obtained by the process of FIG. 1I as a mask, the underlying region 10 is etched. More specifically, by etching the SOG film 14 and the SOC film 13 by using the PS pattern as the mask, the PS pattern is transferred to the SOG film 14 and the SOC film 13. Further, by etching the silicon oxide film 12 by using a pattern of the SOG film 14 and the SOC film 13 as a mask, a trench pattern and a hole pattern formed of the silicon oxide film 12 can be obtained.

Next, in the pattern formation method of the embodiment described above, the reason why the first trench pattern 61, the second trench pattern 62, the first hole patterns 63, and the second hole patterns 64 can be obtained, that is, the reason why the phase-separation pattern 50 as shown in FIG. 1H and FIG. 2 can be obtained will be described.

Figure 4:
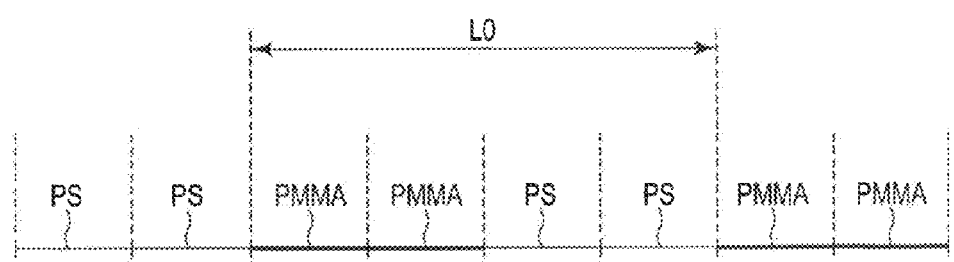
FIG. 4 is an illustration which schematically shows a general bonding state of PMMA and PS.

FIG. 4 is an illustration which schematically shows a general bonding state of PMMA and PS. A unit of a block copolymer corresponds to bonding of one PMMA molecule and one PS molecule. Further, by performing heat treatment, PMMA bonds to PMMA preferentially, and PS bonds to PS preferentially. As a result, by performing the heat treatment, a PS-PS-PMMA-PMMA-PS-PS-PMMA-PMMA arrangement, as shown in FIG. 4, can be obtained. Note that L0 shown in FIG. 4 corresponds to twice the length of one unit of the block copolymer formed by the bonding of one PMMA molecule and one PS molecule. This length L0 may be about 30 nm, for example.

When the method of the above-described embodiment is performed under normal conditions, in the process of FIG. 1H, a phase-separation pattern in which a line pattern formed of PMMA and a line pattern formed of PS are alternately arranged in the second direction is formed. In other words, in each of portions corresponding to the fifth pattern portion 55 and the seventh pattern portion 57 shown in FIG. 1H and FIG. 2, a line pattern formed of only PMMA is formed. More specifically, by performing heat treatment, PMMA is preferentially adhered to the pinning portions 16 of the first guide portion 21 and the second guide portion 22. Also, normally, the pitch between the first guide portion 21 and the second guide portion 22 (the distance between the left end of the first guide portion 21 and the left end of the second guide portion 22) is set to an integral multiple of L0. Accordingly, when the method of the above-described embodiment is performed under normal conditions, a phase-separation pattern in which a line pattern formed of PMMA and a line pattern formed of PS are alternately arranged is formed between the first guide portion 21 and the second guide portion 22, based on the principle described referring to FIG. 4.

In the present embodiment, the method as described above is performed under special conditions that differ from normal. The phase-separation pattern of the present embodiment is formed by appropriately controlling at least one of the width of each of the first guide portion 21 and the second guide portion 22, the pitch between the first guide portion 21 and the second guide portion 22, the length of one unit, of the block copolymer (L0/2) formed by the bonding of one molecule of PMMA (the first polymer) and one molecule of PS (the second polymer), the thickness of each of the first guide portion 21 and the second guide portion 22, an angle (a taper angle) of a side surface of each of the first guide portion 21 and the second guide portion 22, the thickness of the block copolymer film 40, the water contact angle of the neutral portion 18, the water contact angle of the pinning portion 16 of each of the first guide portion 21 and the second guide portion 22, the conditions of heat treatment (the predetermined treatment) for forming the phase-separation pattern 50, and addition of an additive to the block copolymer film 40. By using the appropriate conditions, forming the phase-separation pattern 50 shown in FIG. 1H and FIG. 2 is stabilized in terms of free energy, and the pattern of the present embodiment can be formed.

For example, by adjusting the widths of the first guide portion 21 and the second guide portion 22, the pitch between the first guide portion 21 and the second guide portion 22, and the length (L0/2) of one unit of the block copolymer, the pitch between the first guide portion 21 and the second guide portion 22 is designed to be deviated from an integral multiple of L0. Further, the water contact angle of the neutral portion 18, the conditions of heat treatment for forming the phase-separation pattern 50, etc., are adjusted to appropriate conditions. For example, appropriate conditions are set so that the affinity of the neutral portion 18 for PMMA is higher than that for PS, or the conditions of heat treatment are moderated (i.e., lowering the heat treatment temperature or shortening the heat treatment time). By setting appropriate conditions as described above, the phase-separation pattern 50 as shown in FIG. 1H and FIG. 2 can be formed.

Figure 5:
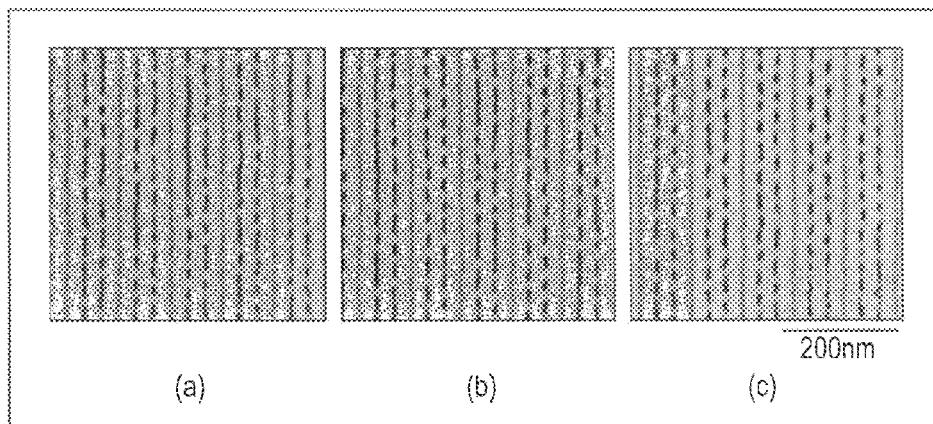
FIG. 5 shows SEM images of patterns obtained when a water contact angle of a neutral portion is varied.

FIG. 5 shows SEM images of patterns obtained when the water contact angle of the neutral portion 16 is varied. FIG. 5(a) shows the case where the water contact angle is 84.4°, FIG. 5 (b) shows the case where the water contact angle is 81.9°, and FIG. 5 (c) shows the case where the water contact angle is 80.5°. As shown in FIG. 5, it can be understood that by reducing the water contact angle of the neutral portion 18 and increasing the affinity of the neutral portion 18 for PMMA, hole patterns are formed more easily.

Figure 6:
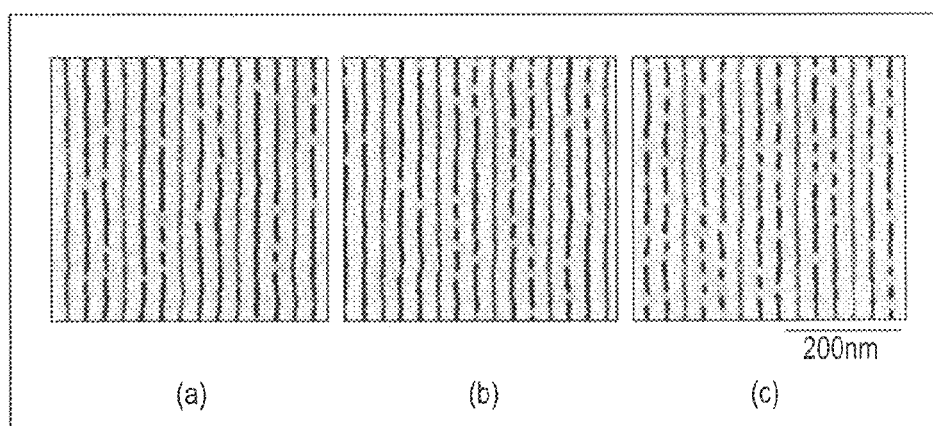
FIG. 6 shows SEM images of patterns obtained when a heat treatment condition is varied.

FIG. 6 shows SEM images of patterns obtained when the neat treatment conditions are varied. FIG. 6 (a) shows the case where the heat treatment temperature is 270°, and the heat treatment time is 30 minutes, FIG. 6 (b) shows the case where the heat treatment temperature is 250° C., and the heat treatment time is 30 minutes, and FIG. 6 (c) shows the case where the heat treatment temperature is 250° C., and the heat treatment time is two minutes. As shown in FIG. 6, it can be understood that by moderating the heat treatment conditions, the hole patterns are formed more easily.

Figure 7:
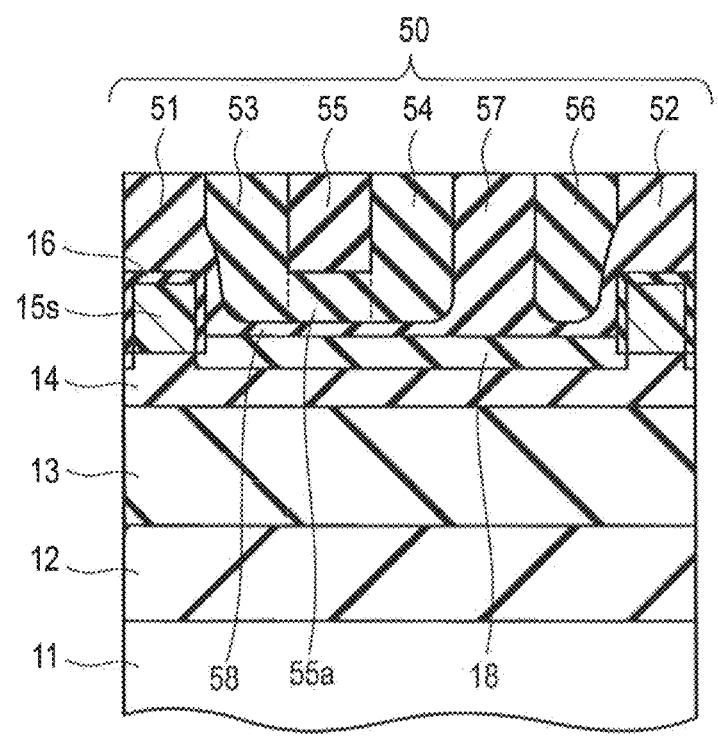
FIG. 7 is an illustration which schematically shows an example of the state of a phase-separation pattern when affinity of the neutral portion for PMMA is made high according to the embodiment.

FIG. 7 is an illustration which schematically shows an example of the state of the phase-separation pattern 50 when the affinity of the neutral portion 18 for PMMA is made high.

As shown in FIG. 7, an interposing portion 53 formed of PMMA is formed between the third pattern portion 53 and the neutral portion 18, between the fourth pattern portion 54 and the neutral portion 18, between the sixth pattern portion 56 and the neutral portion 18, between the first portion 55a of the fifth pattern portion 55 and the neutral portion 18, and between the third portion 57a of the seventh pattern portion 57 and the neutral portion 18. The interposing portion 58 includes a portion which extends from the first pattern portion 51, and a portion which extends from the second pattern portion 52. That is, by making the affinity of the neutral portion 18 for PMMA high, the interposing portion 58 is considered to be formed as the portions formed of PMMA are extended to the surface of the neutral portion 18 from the first pattern portion 51 and the second pattern portion 52, which are formed of PMMA. Further, it is considered that the pattern portions formed of PS (i.e., the third pattern portion 53, the fourth pattern portion 54, the sixth pattern portion 56, the first portion 55a of the fifth pattern portion 55, and the third portion 57a of the seventh pattern portion 57) are formed on the interposing portion 58 formed of PMMA.

As described above, according to the present embodiment, by setting appropriate conditions, it is possible to form a trench pattern and a hole pattern by means of DSA technology, and an efficient pattern formation method can be obtained. In particular, in the semiconductor device (the semiconductor integrated circuit device), it is important to form a microscopic line pattern and a microscopic hole pattern. Therefore, using the method of the present embodiment enables the patterns to be formed efficiently.

Although the pattern formation method of the present embodiment has been described above, the above method can be modified variously.

Figure 8:
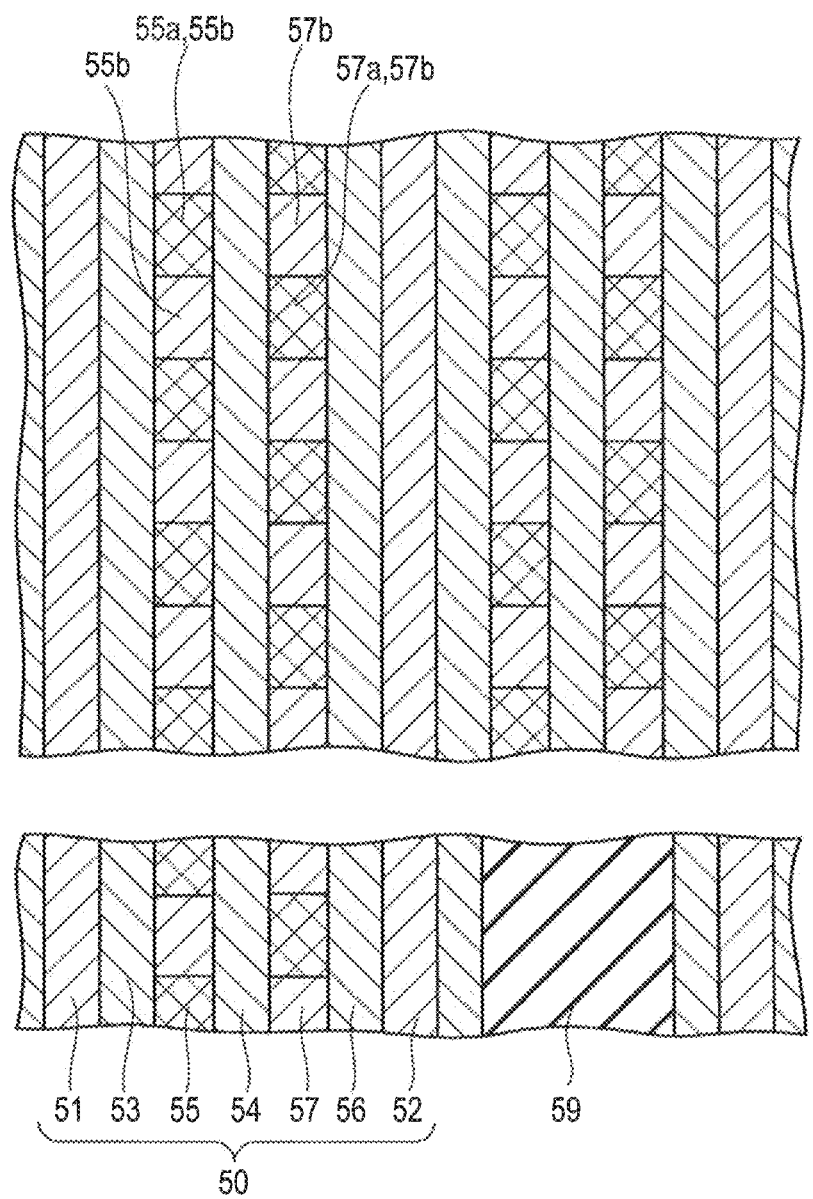
FIG. 8 is a plan view which schematically illustrates a first modification of the embodiment.

FIG. 8 is a plan view which schematically illustrates a first modification of the present embodiment. In the present modification, by setting appropriate conditions, a horizontal lamellar orientation portion 59 is permitted to be formed on the underlying region 10 when the phase-separation pattern 50 is formed by applying heat treatment to the block copolymer film 40. In the horizontal lamellar orientation portion 59, a layer formed of PMMA and a layer formed of PS are alternately stacked. For example, by widening the guide portion, the horizontal lamellar orientation portion 59 can be formed.

Figure 9:
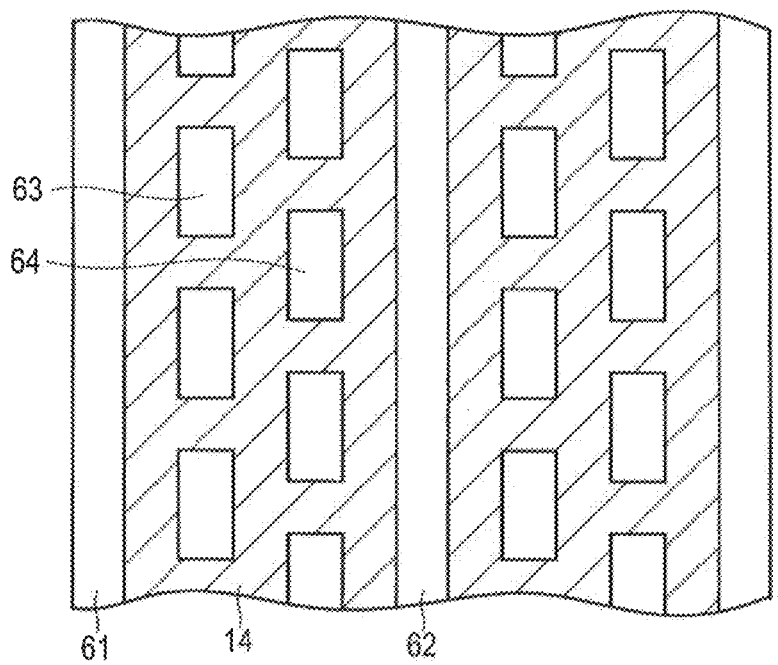
FIG. 9 is a plan view which schematically illustrates a second modification of the embodiment.
Figure 10:
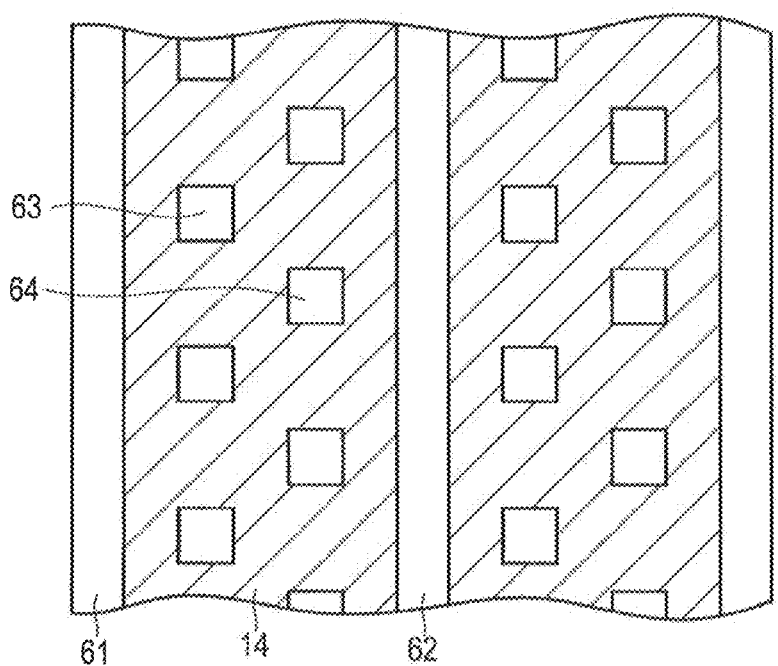
FIG. 10 is a plan view which schematically illustrates a third modification of the embodiment.

FIGS. 9 and 10 are plan views which schematically illustrate second and third modifications of the present embodiment, respectively.

In the above-described embodiment, as shown in FIG. 3, as viewed from the second direction (i.e., the direction which is perpendicular to the direction in which the first trench pattern 61 and the second trench pattern 62 are extended), the edges of the first hole pattern 63 and the second hole pattern 64 are aligned. In the second modification, as shown in FIG. 9, as viewed from the second direction, the first hole pattern 63 and the second hole pattern 64 overlap one another. In the third modification, as shown in FIG. 10, as viewed from the second direction, the first hole pattern 63 and the second hole pattern 64 are separated from each other. By setting appropriate conditions, various patterns as shown in FIGS. 3, 9, and 10 can be formed.

Also, in the above-described embodiment, two hole pattern sequences (a sequence of the first hole patterns 63 and a sequence of the second hole patterns 64) extending in the first direction are formed between the adjacent trench patterns (the first trench pattern 61 and the second trench pattern 62). However, the number of hole pattern sequences can be changed as appropriate. For example, the number of hole pattern sequences may be one, or three or more.

Also, in the above-described embodiment, the first hole pattern 63 and the second hole pattern 64 are arranged diagonally with respect to the direction in which the first trench pattern 61 and the second trench pattern 62 are extended (i.e., the first direction). The angle of diagonal arrangement (the angle formed when the first hole pattern 63 and the second hole pattern 64 are connected by a straight line) can be changed as appropriate by setting appropriate conditions.

Also, in the above-described embodiment, while the resist pattern 15 was formed by a positive resist, it may be formed by a negative resist.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern formation method comprising:
    forming a base structure on an underlying region, the base structure including first and second guide portions each including a pinning portion having a higher affinity for a first polymer than for a second polymer, and each extending in a first direction, and a neutral portion located between the first and second guide portions and having an affinity for the first and second polymers;
    forming a block copolymer film containing the first and second polymers on the base structure;
    performing a predetermined treatment for the block copolymer film, thereby forming first and second pattern portions formed of the first polymer on the first and second guide portions, respectively, forming third and fourth pattern portions formed of the second polymer on the neutral portion, and forming a fifth pattern portion formed of the first and second polymers between the third and fourth pattern portions, the fifth pattern portion including a plurality of first portions formed of the second polymer, and a second portion formed of the first polymer and provided on the neutral portion and the first portions; and
removing the first and second pattern portions and the second portion of the fifth pattern portion to form first and second trench patterns and a plurality of first hole patterns,
wherein performing the predetermined treatment for the block copolymer film, thereby forming the first, second, third, fourth, and fifth pattern portions includes:
forming an interposing portion formed of the first polymer between the third pattern portion and the neutral portion, between the fourth pattern portion and the neutral portion, and between the first portion of the fifth pattern portion and the neutral portion.

2. The method of claim 1, wherein the first portions of the fifth pattern portion are periodically arranged in the first direction.

3. The method of claim 1, wherein the first hole patterns are periodically arranged in the first direction.

4. The method of claim 1, wherein each of the first hole patterns is surrounded by the third and fourth pattern portions and adjacent first portions of the fifth pattern portion.

5. The method of claim 1, wherein the interposing portion includes a portion extending from the first pattern portion, and a portion extending from the second pattern portion.

6. The method of claim 1, wherein removing the first and second pattern portions and the second portion of the fifth pattern portion to form the first and second trench patterns and the plurality of first hole patterns includes removing the first and second guide portions and a part of the neutral portion.

7. The method of claim 1, wherein the first and second guide portions are formed of a resist.

8. The method of claim 1, wherein the first and second guide portions have a same width.

9. The method of claim 1, wherein a pitch between the first and second guide portions is deviated from an integral multiple of L0, where L0 is twice a length of one unit of a block copolymer formed by bonding of one molecule of the first polymer and one molecule of the second polymer.

10. The method of claim 1, wherein the first polymer is polymethyl methacrylate (PMMA), and the second polymer is polystyrene (PS).

11. The method of claim 1, wherein the predetermined treatment includes heat treatment.

12. The method of claim 1, wherein the first, second, third, fourth, and fifth pattern portions are formed by controlling at least one of a width of each of the first and second guide portions, a pitch between the first and second guide portions, a length of one unit of a block copolymer formed by bonding of one molecule of the first polymer and one molecule of the second polymer, a thickness of each of the first and second guide portions, an angle of a side surface of each of the first and second guide portions, a thickness of the block copolymer film, a water contact angle of the neutral portion, a water contact angle of the pinning portion of the first and second guide portions, a condition of the predetermined treatment, and addition of an additive to the block copolymer film.

13. The method of claim 1, wherein performing the predetermined treatment for the block copolymer film, thereby forming the first, second, third, fourth, and fifth pattern portions includes forming a horizontal lamellar orientation portion on the underlying region.

14. A pattern formation method comprising:
forming a base structure on an underlying region, the base structure including first and second guide portions each including a pinning portion having a higher affinity for a first polymer than for a second polymer, and each extending in a first direction, and a neutral portion located between the first and second guide portions and having an affinity for the first and second polymers;
forming a block copolymer film containing the first and second polymers on the base structure;
performing a predetermined treatment for the block copolymer film, thereby forming first and second pattern portions formed of the first polymer on the first and second guide portions, respectively, forming third and fourth pattern portions formed of the second polymer on the neutral portion, and forming a fifth pattern portion formed of the first and second polymers between the third and fourth pattern portions, the fifth pattern portion including a plurality of first portions formed of the second polymer, and a second portion formed of the first polymer and provided on the neutral portion and the first portions; and
removing the first and second pattern portions and the second portion of the fifth pattern portion to form first and second trench patterns and a plurality of first hole patterns,
wherein forming the base structure includes forming a resist pattern on the underlying region, slimming the resist pattern, forming the pinning portion on a surface of the slimmed resist pattern, and forming the neutral portion on the underlying region which is not covered with the slimmed resist pattern.

15. A pattern formation method comprising:
forming a base structure on an underlying region, the base structure including first and second guide portions each including a pinning portion having a higher affinity for a first polymer than for a second polymer, and each extending in a first direction, and a neutral portion located between the first and second guide portions and having an affinity for the first and second polymers;
forming a block copolymer film containing the first and second polymers on the base structure;
performing a predetermined treatment for the block copolymer film, thereby forming first and second pattern portions formed of the first polymer on the first and second guide portions, respectively, forming third and fourth pattern portions formed of the second polymer on the neutral portion, and forming a fifth pattern portion formed of the first and second polymers between the third and fourth pattern portions, the fifth pattern portion including a plurality of first portions formed of the second polymer, and a second portion formed of the first polymer and provided on the neutral portion and the first portions; and
removing the first and second pattern portions and the second portion of the fifth pattern portion to form first and second trench patterns and a plurality of first hole patterns,
wherein
the first, third, fifth, fourth, and second pattern portions are arranged in this order in a second direction perpendicular to the first direction,
performing the predetermined treatment for the block copolymer film, thereby forming the first, second, third, fourth, and fifth pattern portions includes forming, on the neutral portion and between the second and fourth pattern portions, a sixth pattern portion formed of the second polymer and extending in the first direction, and forming, on the neutral portion and between the fourth and sixth pattern portions, a seventh pattern portion formed of the first and second polymers and extending in the first direction, the seventh pattern portion including a plurality of third portions formed of the second polymer and arranged in the first direction, and a fourth portion formed of the first polymer and provided on the neutral portion and the third portions, and removing the first and second pattern portions and the second portion of the fifth pattern portion to form the first and second trench patterns and the plurality of first hole patterns includes removing the fourth portion of the seventh pattern portion to form a plurality of second hole patterns arranged in the first direction.

16. The method of claim 15, wherein the third portions of the seventh pattern portion are periodically arranged in the first direction.

17. The method of claim 15, wherein each of the second hole patterns is surrounded by the fourth and sixth pattern portions, and adjacent third portions of the seventh pattern portion.

18. The method of claim 15, wherein the first portions of the fifth pattern portion and the third portions of the seventh pattern portion are arranged alternately, as viewed from the second direction.

19. The method of claim 15, wherein the first hole patterns and the second hole patterns are arranged alternately, as viewed from the second direction.

* * * * *